(12) United States Patent
Nair et al.

(10) Patent No.: US 6,960,828 B2
(45) Date of Patent: Nov. 1, 2005

(54) ELECTRONIC STRUCTURES INCLUDING CONDUCTIVE SHUNT LAYERS

(75) Inventors: Krishna K. Nair, Apex, NC (US); Glenn A. Rinne, Apex, NC (US); William E. Batchelor, Raleigh, NC (US)

(73) Assignee: Unitive International Limited, Curacao (AN)

( * ) Notice: Subject to any disclaimer, the term of this patent is extended or adjusted under 35 U.S.C. 154(b) by 29 days.

(21) Appl. No.: 10/601,938

(22) Filed: Jun. 23, 2003

(65) Prior Publication Data

US 2004/0053483 A1    Mar. 18, 2004

Related U.S. Application Data

(60) Provisional application No. 60/391,511, filed on Jun. 25, 2002.

(51) Int. Cl.[7] .............................................. H01L 23/48
(52) U.S. Cl. ..................... 257/734; 257/737; 257/738
(58) Field of Search .............................. 257/737, 734, 257/738

(56) References Cited

U.S. PATENT DOCUMENTS

| | | |
|---|---|---|
| 162,257 A | 11/1875 | Yung |
| 3,105,869 A | 10/1963 | Branch et al. |
| 3,244,947 A | 4/1966 | Slater |
| 3,259,814 A | 7/1966 | Green |
| 3,274,458 A | 9/1966 | Boyer et al. |
| 3,316,465 A | 4/1967 | von Bermuth et al. |
| 3,458,925 A | 8/1969 | Napier et al. |
| 3,461,357 A | 8/1969 | Mutter et al. |
| 3,489,965 A | 1/1970 | Helsdon |
| 3,501,681 A | 3/1970 | Weir |
| 3,663,184 A | 5/1972 | Wood et al. |
| 3,760,238 A | 9/1973 | Hamer et al. |
| 3,770,874 A | 11/1973 | Krieger et al. |
| 3,871,014 A | 3/1975 | King et al. |
| 3,871,015 A | 3/1975 | Lin et al. |
| 3,897,871 A | 8/1975 | Zimnbauer |
| 3,916,080 A | 10/1975 | Wakamatsu |
| 3,942,187 A | 3/1976 | Gelsing et al. |

(Continued)

FOREIGN PATENT DOCUMENTS

CN    CN1269607    1/2002

(Continued)

OTHER PUBLICATIONS

W.J. Choi et al; *Electromigration of Flip Chip Solder Bump on Cu/Ni(V) Al Thin Film Under Bump Metallization*; 2002 Electronic Components and Technology Conference; pp 1201-1205.

(Continued)

*Primary Examiner*—Christian Wilson
*Assistant Examiner*—Douglas M. Menz
(74) *Attorney, Agent, or Firm*—Myers Bigel Sibley & Sajovec (57) ABSTRACT

Methods of forming an electronic structure may include forming a seed layer on an electronic substrate, and forming a conductive shunt layer on portions of the seed layer wherein portions of the seed layer are free of the conductive shunt layer. A conductive barrier layer may be formed on the conductive shunt layer opposite the seed layer wherein the conductive shunt layer comprises a first material and wherein the barrier layer comprises a second material different than the first material. Moreover, a solder layer may be formed on the barrier layer opposite the conductive shunt layer wherein the solder layer comprises a third material different than the first and second materials. Related structures are also discussed.

18 Claims, 6 Drawing Sheets

U.S. PATENT DOCUMENTS

| | | |
|---|---|---|
| 3,959,577 A | 5/1976 | Frink |
| 3,986,255 A | 10/1976 | Mandal |
| 3,993,123 A | 11/1976 | Chu et al. |
| 4,074,342 A | 2/1978 | Honn et al. |
| 4,113,578 A | 9/1978 | Del Monte |
| 4,113,587 A | 9/1978 | Chikamori |
| 4,168,480 A | 9/1979 | De Lucia |
| 4,244,002 A | 1/1981 | Sato et al. |
| 4,257,905 A | 3/1981 | Christophorou et al. |
| 4,266,282 A | 5/1981 | Henle et al. |
| 4,273,859 A | 6/1981 | Mones et al. |
| 4,382,517 A | 5/1983 | Welsch |
| 4,449,580 A | 5/1984 | Reisman et al. |
| 4,473,263 A | 9/1984 | Sunstein |
| 4,511,873 A | 4/1985 | Baier et al. |
| 4,532,576 A | 7/1985 | Reimer |
| 4,545,610 A | 10/1985 | Lakritz et al. |
| 4,563,697 A | 1/1986 | Miura |
| 4,565,901 A | 1/1986 | Hirooka et al. |
| 4,657,146 A | 4/1987 | Walters |
| 4,661,375 A | 4/1987 | Thomas |
| 4,733,813 A | 3/1988 | Le Meau et al. |
| 4,752,027 A | 6/1988 | Gschwend |
| 4,763,829 A | 8/1988 | Sherry |
| 4,783,722 A | 11/1988 | Osaki et al. |
| 4,817,850 A | 4/1989 | Wiener-Avnear et al. |
| 4,830,264 A | 5/1989 | Bitaillou et al. |
| 4,840,302 A | 6/1989 | Gardner et al. |
| 4,855,809 A | 8/1989 | Malhi et al. |
| 4,878,611 A | 11/1989 | Lo Vasco et al. |
| 4,893,403 A | 1/1990 | Heflinger et al. |
| 4,897,508 A | 1/1990 | Mahulikar et al. |
| 4,897,918 A | 2/1990 | Osaka et al. |
| 4,927,505 A | 5/1990 | Sharma et al. |
| 4,931,410 A | 6/1990 | Tokanaga et al. |
| 4,940,181 A | 7/1990 | Juskey, Jr. et al. |
| 4,948,754 A | 8/1990 | Kondo et al. |
| 4,950,623 A | 8/1990 | Dishon |
| 4,962,058 A | 10/1990 | Cronin et al. |
| 5,019,943 A | 5/1991 | Fassbender |
| 5,022,580 A | 6/1991 | Pedder |
| 5,024,372 A | 6/1991 | Altman et al. |
| 5,046,161 A | 9/1991 | Takada |
| 5,048,747 A | 9/1991 | Clark et al. |
| 5,113,314 A | 5/1992 | Wheeler et al. |
| 5,135,155 A | 8/1992 | Kang et al. |
| 5,152,451 A | 10/1992 | Derveaux et al. |
| 5,154,341 A | 10/1992 | Melton et al. |
| 5,160,409 A | 11/1992 | Moore et al. |
| 5,162,257 A | 11/1992 | Yung |
| 5,194,137 A | 3/1993 | Moore et al. |
| 5,216,280 A | 6/1993 | Tanaka et al. |
| 5,227,664 A | 7/1993 | Toshio |
| 5,234,149 A | 8/1993 | Katz et al. |
| 5,239,447 A | 8/1993 | Cotues et al. |
| 5,240,881 A | 8/1993 | Cayetano et al. |
| 5,250,843 A | 10/1993 | Eichelberger |
| 5,289,925 A | 3/1994 | Newmark |
| 5,293,006 A | 3/1994 | Yung |
| 5,325,265 A | 6/1994 | Turlik et al. |
| 5,327,013 A | 7/1994 | Moore et al. |
| 5,327,327 A | 7/1994 | Frew et al. |
| 5,335,795 A | 8/1994 | Chizen |
| 5,347,428 A | 9/1994 | Carson et al. |
| 5,354,711 A | 10/1994 | Heitzmann et al. |
| 5,391,514 A | 2/1995 | Gall et al. |
| 5,406,701 A | 4/1995 | Pepe et al. |
| 5,409,862 A | 4/1995 | Wada et al. |
| 5,424,920 A | 6/1995 | Miyake |
| 5,432,729 A | 7/1995 | Carson et al. |
| 5,453,582 A | 9/1995 | Amano et al. |
| 5,470,787 A | 11/1995 | Greer |
| 5,475,280 A | 12/1995 | Jones et al. |
| 5,492,235 A | 2/1996 | Crafts et al. |
| 5,547,740 A | 8/1996 | Higdon et al. |
| 5,557,502 A | 9/1996 | Bannerjee et al. |
| 5,616,962 A | 4/1997 | Ishikawa et al. |
| 5,627,396 A | 5/1997 | James et al. |
| 5,634,268 A | 6/1997 | Dalal et al. |
| 5,680,296 A | 10/1997 | Hileman et al. |
| 5,736,456 A | 4/1998 | Akram |
| 5,739,053 A | 4/1998 | Kawakita et al. |
| 5,744,382 A | 4/1998 | Kitayama et al. |
| 5,751,556 A | 5/1998 | Butler et al. |
| 5,773,359 A | 6/1998 | Mitchell et al. |
| 5,793,116 A | 8/1998 | Rinne et al. |
| 5,812,378 A | 9/1998 | Fielstad et al. |
| 5,851,911 A | 12/1998 | Farnworth |
| 5,886,393 A | 3/1999 | Merrill et al. |
| 5,892,179 A | 4/1999 | Rinne et al. |
| 5,898,574 A | 4/1999 | Tan et al. |
| 5,902,686 A | 5/1999 | Mis |
| 5,923,539 A | 7/1999 | Matsui et al. |
| 5,937,320 A | 8/1999 | Andricacos et al. |
| 5,963,793 A | 10/1999 | Rinne et al. |
| 5,990,472 A | 11/1999 | Rinne |
| 6,133,065 A | 10/2000 | Akram |
| 6,134,120 A | 10/2000 | Baldwin |
| 6,162,652 A * | 12/2000 | Dass et al. .................... 438/18 |
| 6,169,325 B1 | 1/2001 | Azuma |
| 6,208,018 B1 | 3/2001 | Ma et al. |
| 6,221,682 B1 | 4/2001 | Danziger et al. |
| 6,222,279 B1 | 4/2001 | Mis et al. |
| 6,320,262 B1 | 11/2001 | Murakami |
| 6,335,104 B1 | 1/2002 | Sambucetti et al. |
| 6,388,203 B1 | 5/2002 | Rinne et al. |
| 6,392,163 B1 | 5/2002 | Rinne et al. |
| 6,415,974 B2 | 7/2002 | Jao |
| 6,418,033 B1 | 7/2002 | Rinne |
| 6,419,974 B1 | 7/2002 | Silva et al. |
| 6,441,487 B2 | 8/2002 | Elenius et al. |
| 6,452,270 B1 | 9/2002 | Huang |
| 6,452,271 B2 | 9/2002 | Jiang et al. |
| 6,521,996 B1 | 2/2003 | Seshan |
| 6,620,722 B2 | 9/2003 | Kuo et al. |
| 6,622,907 B2 * | 9/2003 | Fanti et al. .................. 228/215 |
| 6,668,449 B2 | 12/2003 | Rumsey et al. |
| 6,762,122 B2 | 7/2004 | Mis et al. |
| 6,835,643 B2 | 12/2004 | Akram |
| 6,853,076 B2 * | 2/2005 | Datta et al. .................. 257/738 |
| 2001/0042918 A1 | 11/2001 | Yanagida |
| 2002/0000665 A1 | 1/2002 | Barr et al. |
| 2002/0079576 A1 | 6/2002 | Seshan |
| 2002/0086520 A1 | 7/2002 | Chiang |
| 2002/0093098 A1 | 7/2002 | Barr et al. |
| 2003/0060040 A1 | 3/2003 | Lee et al. |
| 2003/0107137 A1 | 6/2003 | Stierman et al. |

FOREIGN PATENT DOCUMENTS

| | | |
|---|---|---|
| DE | 42 05 029 C | 2/1993 |
| DE | 43 23 799 A1 | 1/1994 |
| DE | 197 41 436 | 12/1998 |
| EP | 0 603 296 | 6/1994 |
| EP | 0 609 062 A1 | 8/1994 |
| EP | 0 736 972 A1 | 10/1996 |
| EP | 0 782 191 A2 | 2/1997 |
| EP | 0 782 191 | 7/1997 |
| EP | 1 146 552 | 10/2001 |
| FR | 2 406 893 | 10/1978 |
| FR | 2 688 628 | 9/1993 |
| FR | 2 705 832 | 12/1994 |
| GB | 1288564 | 9/1972 |
| GB | 2062 963 | 5/1981 |

| | | |
|---|---|---|
| GB | 2 194 387 | 3/1988 |
| JP | 54-128669 | 10/1979 |
| JP | 55-111127 | 8/1980 |
| JP | 57-73952 | 5/1982 |
| JP | 57-197838 | 12/1982 |
| JP | 59-154041 | 9/1984 |
| JP | 6-116552 | 1/1986 |
| JP | 63099558 | 4/1988 |
| JP | 63-222445 | 9/1988 |
| JP | 4-150033 | 5/1992 |
| JP | 07066207 | 1/1994 |
| WO | WO93/02831 | 2/1993 |
| WO | WO93/22475 | 11/1993 |
| WO | WO 96/30933 | 10/1996 |
| WO | WO96/31905 | 10/1996 |
| WO | WO98/06118 | 2/1998 |
| WO | WO 02/03461 | 1/2002 |

OTHER PUBLICATIONS

K. Zeng et al; *Six cases of reliability study of Pb-free solder joints in electronic packaging technology*, Reports: A Review Journal; Materials Science and Engineering R 38 (2002) pp 55-105.

International Search Report for PCT/US 03/20790.

Howell et al: "Area Array Solder Interconnection Technology for the Three-Dimensional Silicon Cube", Proceedings of the 1995 45$^{th}$ Electronic Components & Technology Conference, pp 1174-1178.

Lineback, "3D IC Packaging Moves Closer to Commercial Use", Electronic World News, May 21, 1990, p 15.

Multimedia Card Association, www.mmca.org.

SanDisk Corporation, SanDisk Flash Data Storage, San Disk Compact Flash™ and MultiMedia Card: Small Form Factor Solutions, 1999.

Guckel et al., *Electromagnetic Linear Actuators with Inductive Position Sensing for Micro Relay, Micro Value and Precision Positioning Applications*, Transducers '95, Eurosensors IX, The 8$^{th}$ International Conference on Solid-State Sensors and Actuators, and Eurosensors IX, pp 324-327.

Hashimoto et al; *Thermally Controlled Magnetization Microrelay*, Transducers '95, Eurosensors IX, The 8$^{th}$ International Conference on Solid-State Sensors and Actuators and Eurosensors IX, pp 361-364.

Drake et al; *An Electrostatically Actuated Micro-Relay*, Transducers '95, Eurosensors IX, The 8$^{th}$ In ternational Conference on Solid-State Sensors and Actuators, and Eurosensors IX, pp 380-383.

Knüppel, *Rugged Design for Reliable Switching: Micro a Relay Sets New Automotive Standards*, Components XXIX (1994), No. 4, pp 30-32.

Hosaka et al; Electromagnetic Microrelays: Concepts and Fundamental Characteristics, Sensors and Actuators A, 40 (1994), pp. 41-47.

Specification Sheet, *NaiS, Ultra Low Profile 2 Amp-Pllarized Relay*, TK-Relays.

PCB Assembly, *Electronic Packaging & Production*, vol. 35, No. 1, p. 40 (Jan. 1995).

Adema et al., *Flip Chip Technology: A Method for Providing Known Good Die with High Density Interconnections*, MCM '94 Proceedings, pp. 41-49.

Datta et al., *Electrochemical Fabrication of mechanically Robust PbSn C4 Interconnections*, J. Electrochem. Soc., vol. 142, No. 11, The Electrochemical Society, Inc., Nov. 1995, pp. 3779-3785.

Hirsch, *Tin-Lead, Lead and Tin Plating*, Metal Finishing, Guidebook Directory 1987, 55$^{th}$ Guidebood-Directory Issue 1987, Mid Jan. 1987, vol. 85, No. 1A, ISSN 0026-0576, pp. 280-284.

Inaba et al; *Solder Bump Formation Using Electroless Plating and Ultrasonic Soldering*, IEEE Transactions On Components, Hybrids, and Manufacturing Technology, vol. 13, No. 1, Mar. 1990, pp. 119-123.

K. Yung et al; *Electroplated Solder Joints for Flip-Chip Applications*, Transactions on Components, Hybrids, and Manufacturing Technology, vol. 14, No. 3, Sep. 1991, pp. 549-559.

E.K. Yung et al; *Flip-Chip Process Utilizing Electroplated Solder Joints*, Proceedings of the Technical Conference, 1990 International Electronics Packaging Conference, Sep. 10-12, 1990, pp 1065-1079.

T.G. Tessier et al; *Process Considerations in Fabricating Thin Film Multi-chip Modules*, Proceedings of the Technical Conference 1989 International Electronics Packaging Conference, 1989.

PCT International Search Report dated Dec. 9, 1992 of International Appln. No. PCT/US 92/07722 filed Sep. 11, 1992.

Edelstein, D.C., et al; Derwent Publications Ltd. London, GB; AN 2002-308284 XP-002243726.

International Search Report for PCT/US 02/30697.

Jean Audel, et al; *Low Cost Bumping Process for Flip Chip*, Proc. 1995 International Flip Chip, BGA, and Ado Pkg. Symposium ITAP 95, '95 Flip Chip, BGA, TAB & AP Symposium, pp 16-21 (1995).

M. Data, et al., *Electrochemical Fabrication of Mechanically Robust PbSn C4 Interconnections*, J. Electrochem. Soc., vol. 142, No. 11, pp 3779-3785 (Nov. 1995).

J.D. Mis, et al; *Flip Chip Production Experience: Some Design, Process, Reliability, and Cost Considerations*, ISHM '96 Proceedings, Proc. 1996 International Symposium on Microelectronics SPIE vol. 2920, pp 291-295 (1996).

S.K. Kang, et al; *Interfacial Reactions During Soldering With Lead-Tin Eutectic and Lead (Pb)-Free, Tin-Rich Solders, Journal of Electronic Materials, vol 25, No. 7, pp 1113-1120 (1996)*.

Eric Jung, et al. *The Influence of NiSn Intermetallics on the Performance of Flip Chip Contacts Using a Low Cost Electroless Nickel Bumping Approach*, IEPS Proceedings of the Technical Conference, 1996.

Electronics Packaging Conference, Austin, Texas, pp 14-25 (Sep. 29-Oct. 1, 1996).

* cited by examiner

FIGURE 4E

ELECTRONIC STRUCTURES INCLUDING CONDUCTIVE SHUNT LAYERS

RELATED APPLICATION

This application claims priority from U.S. Provisional Patent Application No. 60/391,511 filed on Jun. 25, 2002, the disclosure of which is hereby incorporated herein by reference in its entirety.

FIELD OF THE INVENTION

The present invention relates to the field of electronics, and more particularly to electronic structures including solder layers and related methods.

BACKGROUND

Solder layers may be used to provide electrical and mechanical coupling between two electronic substrates, such as in flip-chip bonding. In particular, a solder layer may be provided on a conductive pad of an electronic substrate (such as an input/output pad of an integrated circuit substrate), and the solder layer can be used to bond the electronic substrate to a next level of packaging such as a printed circuit board, a ceramic substrate, and/or another integrated circuit device. Accordingly, the solder layer may provide an electrical interconnection between the electronic substrate and the next level of packaging.

More particularly, a solder bump may be provided on a portion of a conductive pad exposed through a via in an insulating layer. In addition, a relatively thin underbump metallurgy (UBM) layer may promote adhesion, provide a plating electrode, and/or provide a routing conductor. An insulating layer on the electronic structure may include a via therein exposing a portion of the conductive pad on which the solder layer is provided. As current flowing in a conventional structure reaches an edge of a solder bump via, a lower resistance of the bump may cause most of the current to turn the corner at the via edge. A non-uniform current density may result, and a non-uniform current density may reduce reliability.

More particularly, a relatively high current density at the via edge may accelerate local electromigration of the solder layer at the via edge. Solder, for example, may be particularly susceptible to electromigration because of its relatively low melting temperature. Diffusion of metal in the solder layer away from the via edge may result in formation of a void in the solder layer adjacent the via edge. The void may block current flow thus forcing the current to travel farther past the via edge before turning toward the solder. Accordingly, a void may grow laterally along an interface between the solder and the conductive pad.

Solder layers may be relatively sensitive to electromigration as discussed, for example, by W. J. Choi et al. in "Electromigration Of Flip Chip Solder Bump On Cu/Ni(V)/Al Thin Film Under Bump Metallization" (Proceedings of the IEEE Electronic Components Technology Conference, 2002). The disclosure of the Choi et al. reference is hereby incorporated herein in its entirety by reference.

SUMMARY

According to embodiments of the present invention, methods of forming an electronic structure may include forming a seed layer on an electronic substrate, and forming a conductive shunt layer on portions of the seed layer wherein portions of the seed layer are free of the shunt layer. A conductive barrier layer may be formed on the conductive shunt layer opposite the seed layer wherein the shunt layer comprises a first material and wherein the barrier layer comprises a second material different than the first material. Moreover, a solder layer may be formed on the barrier layer opposite the shunt layer wherein the solder layer comprises a third material different than the first and second materials.

After forming the solder layer, portions of the seed layer free of the solder layer may be removed. The shunt layer may include a layer of a metal such as copper, and the conductive shunt layer may have a thickness of at least approximately 0.5 $\mu$m. In addition, the conductive shunt layer may have a thickness of at least approximately 1.0 $\mu$m, and more particularly, the conductive shunt layer may have a thickness in the range of approximately 1.0 $\mu$m to 5.0 $\mu$. The barrier layer may include a layer of a metal such as nickel, platinum, palladium, and/or combinations thereof. The barrier layer may also include a passivation layer, such as a layer of gold, thereon.

The seed layer may include an adhesion layer of a fourth material different than the first material of the conductive shunt layer, and the adhesion layer may include a layer of a metal such as titanium, tungsten, chrome, and/or combinations thereof. In addition, the seed layer may include a plating conduction layer on the adhesion layer opposite the substrate, and the plating conduction layer may include a layer of the first material of the conductive shunt layer.

After forming the seed layer, a mask layer may be formed on the seed layer wherein the mask layer has a pattern exposing a surface portion of the seed layer. Accordingly, the conductive shunt layer can be formed by plating the conductive shunt layer on the exposed surface portion of the seed layer, the conductive barrier layer can be formed by plating the conductive barrier layer on the conductive shunt layer, and the solder layer can be formed by plating the solder layer on the respective barrier layer.

Forming the electronic device can also include forming a conductive pad on a substrate, and forming an insulating layer on the substrate and on the conductive pad wherein the insulating layer has a via therein so that a portion of the conductive pad opposite the substrate is free of the insulating layer. More particularly, the seed layer can be on the insulating layer, on sidewalls of the via, and on the portions of the conductive pad free of the insulating layer, and the conductive shunt layer can be on the seed layer opposite the portions of the conductive pad free of the insulating layer, opposite the sidewalls of the via, and opposite portions of the insulating layer adjacent the via.

According to additional embodiments of the present invention, forming an electronic structure can include forming a conductive pad on a substrate, and forming an insulating layer on the substrate and on the conductive pad wherein the insulating layer has a via therein so that a portion of the conductive pad opposite the substrate is free of the insulating layer. A conductive shunt layer may be formed on the portion of the conductive pad free of the insulating layer, on sidewalls of the via, and on surface portions of the insulating layer surrounding the via opposite the substrate and the conductive pad, and the conductive shunt layer can have a thickness of at least approximately 0.5 $\mu$m. A conductive barrier layer can be formed on the conductive shunt layer opposite the conductive pad and the insulating layer wherein the shunt layer and the barrier layer comprise different materials. In addition, a solder layer can be formed on the barrier layer opposite the shunt layer wherein the solder layer and the barrier layer comprise different materials. The shunt layer may have a thickness of at least approximately 1.0 μm, and the shunt layer can have a thickness in the range of approximately 1.0 μm to 5.0 μm.

Before forming the conductive shunt layer, a seed layer may be formed on the conductive pad and on the insulating layer so that the seed layer is between the conductive shunt layer and the portion of the conductive pad free of the insulating layer and so that the seed layer is between the conductive shunt layer and the insulating layer.

The seed layer may include an adhesion layer of a material different than that of the conductive shunt layer, and the adhesion layer may include a layer of a metal such as titanium, tungsten, chrome, and/or combinations thereof. In addition, the seed layer may include a plating conduction layer on the adhesion layer opposite the substrate, wherein the plating conduction layer and the conductive shunt layer comprise a common material. Moreover, the conductive shunt layer, the conductive barrier layer, and the solder layer may be on portions of the seed layer, and portions of the seed layer may be free of the conductive shunt layer, the conductive barrier layer, and the solder layer. After forming the solder layer, portions of the seed layer free of the conductive shunt layer, free of the conductive barrier layer, and free of the solder layer may be removed.

After forming the seed layer, a mask layer may be formed on the seed layer, wherein the mask layer has a pattern exposing a surface portion of the seed layer opposite the portion of the conductive pad free of the insulating layer, opposite sidewalls of the via, and opposite surface portions of the insulating layer surrounding the via. Accordingly, forming the conductive shunt layer may include plating the conductive shunt layer on the exposed portion of the seed layer, forming the conductive barrier layer may include plating the conductive barrier layer on the conductive shunt layer, and forming the solder layer may include plating the solder layer on the barrier layer. The mask layer may be removed after forming the solder layer, and portions of the seed layer surrounding the conductive shunt layer may be removed after removing the mask layer. More particularly, the conductive shunt layer may include a layer of a metal such as copper, and the conductive barrier layer may include a layer of a metal such as nickel, platinum, palladium, and/or combinations thereof. According to yet additional embodiments of the present invention, methods of forming an electronic structure may include forming a primary conductive trace on an electronic substrate, the primary conductive trace having a first width, and forming a conductive pad on the electronic substrate, the conductive pad having a second width greater than the first width. An electrical coupling may also be formed between the primary conductive trace and the conductive pad, wherein the electrical coupling provides at least two separate current flow paths between the primary conductive trace and the conductive pad.

The electrical coupling may include a flared coupling extending from the primary conductive trace to the conductive pad and having a perforation therein. The electrical coupling may include first and second traces extending from the primary conductive trace to spaced apart portions of the conductive pad. The first and second traces extend to opposite sides of the conductive pad. In an alternative, the conductive pad may be circular, and the first and second traces may extend tangentially from different portions of the circular conductive pad and meet at the primary conductive trace. The first and second traces may extend from the circular pad in parallel directions and turn to meet at the primary conductive trace, and/or the electrical coupling may include a third trace extending from the primary conductive trace to the conductive pad between the first and second traces. Moreover, the third trace may have a width that is less than a width of either of the first and second traces.

In addition, a solder layer may be formed on the conductive pad, and a second electronic substrate may be provided on the solder layer wherein at least one of the first and second traces can be coupled to the conductive pad adjacent to a portion of the solder layer subject to compressive stress. In addition, an insulating layer may be formed on the electronic substrate, on the conductive trace, on the conductive pad, and on the electrical coupling, wherein the insulating layer has a via therein so that a portion of the conductive pad is free of the insulating layer. The electronic substrate may include a semiconductor substrate, a contact pad on the semiconductor substrate, and an insulating layer on the semiconductor substrate and the contact pad, and the insulating layer may have a via therein so that a portion of the contact pad is free of the insulating layer. Moreover, the conductive trace, the conductive pad, and the electrical coupling may be on the insulating layer opposite the substrate, and the conductive trace may be electrically coupled with the contact pad through the via.

According to yet additional embodiments of the present invention, an electronic structure may include an electronic substrate and a seed layer on the electronic substrate. A conductive shunt layer may be on portions of the seed layer wherein portions of the seed layer are free of the conductive shunt layer, and a conductive barrier layer may be on the conductive shunt layer opposite the seed layer wherein the shunt layer comprises a first material and wherein the barrier layer comprises a second material different than the first material. In addition, a solder layer may be on the barrier layer opposite the shunt layer.

According to more embodiments of the present invention, an electronic structure may include a conductive pad on a substrate, and an insulating layer on the substrate and on the conductive pad, wherein the insulating layer has a via therein so that a portion of the conductive pad opposite the substrate is free of the insulating layer. A conductive shunt layer may be on the portion of the conductive pad free of the insulating layer, on sidewalls of the via, and on surface portions of the insulating layer surrounding the via opposite the substrate and the conductive pad, and the conductive shunt layer may have a thickness of at least approximately 0.5 μm. In addition, a conductive barrier layer may be on the conductive shunt layer opposite the conductive pad and the insulating layer wherein the shunt layer and the barrier layer comprise different materials, and a solder layer may be on the barrier layer opposite the shunt layer.

According to still more embodiments of the present invention, an electronic structure may include an electronic substrate, and a primary conductive trace on the electronic substrate, the primary conductive trace having a first width. A conductive pad on the electronic substrate may have a second width greater than the first width. In addition, an electrical coupling between the primary conductive trace and the conductive pad may provide at least two separate current flow paths between the primary conductive trace and the conductive pad.

DETAILED DESCRIPTION

The present invention will now be described more fully hereinafter with reference to the accompanying drawings, in which embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. It will also be understood that when an element is referred to as being "coupled" or "connected" to another element, it can be directly coupled or connected to the other element, or intervening elements may also be present. Like numbers refer to like elements throughout.

According to embodiments of the present invention, a conductive shunt can be provided to distribute current across a contact surface of a solder structure, such as a solder bump. For example, a via can be provided in an insulating layer exposing portions of a contact pad, a conductive shunt can be provided on the exposed portions of the contact pad and on sidewalls of the via, and a solder layer can be provided on the conductive shunt opposite the contact pad and opposite the via sidewalls. More particularly, the conductive shunt can be a layer of a metal, such as copper, having a thickness of at least 0.5 $\mu$m. Current can thus be conducted through the conductive shunt along sidewalls of the via to provide a more uniform distribution of current density throughout the solder structure. Accordingly, electromigration in the solder structure can be reduced, void formation in the solder structure can be reduced, and/or a useful lifetime of the solder structure can be increased.

Figure 1A:
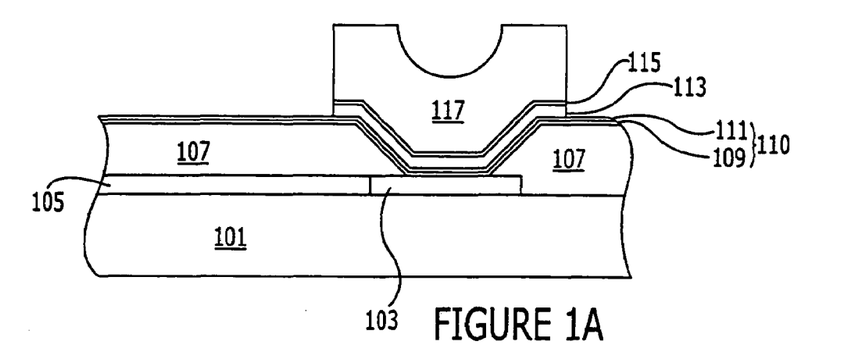
FIGS. 1A–C are cross-sectional views illustrating steps of forming electronic structures according to embodiments of the present invention.
Figure 1B:
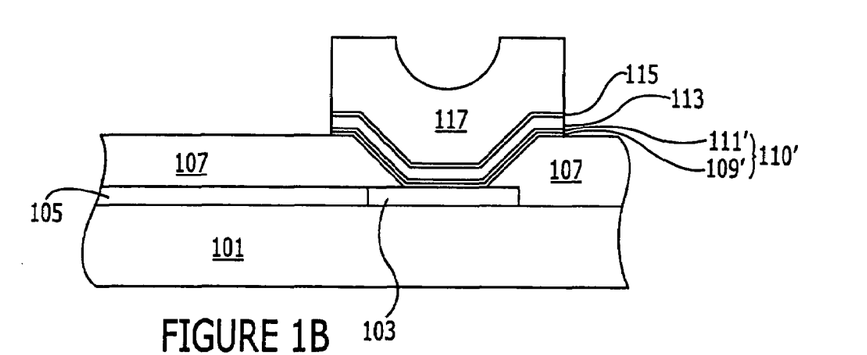
Figure 1C:
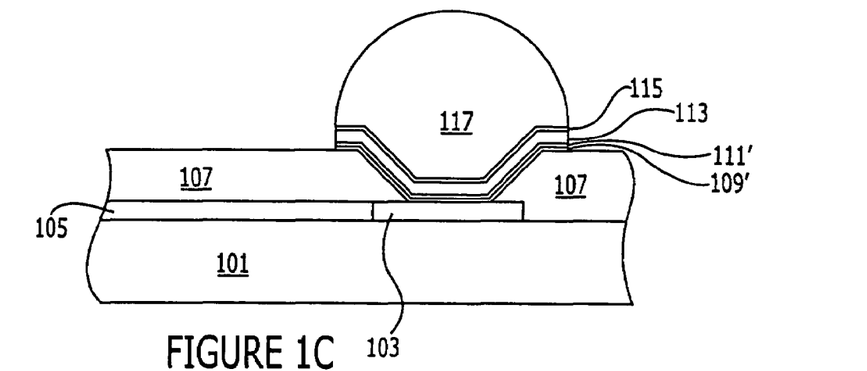

Steps of forming electronic structures including conductive shunt layers according to embodiments of the present invention are illustrated in FIGS. 1A–C. As shown in FIG. 1A, an electronic structure may include a conductive pad 103 on a substrate 101, and an insulating layer 107 on the substrate 101 and conductive pad 103 with a via therein so that portions of the conductive pad 103 are free of the insulating layer 107. In addition, the electronic structure may include a conductive trace 105 providing coupling between the conductive pad 103 and other portions of the electronic structure. The conductive trace 105, for example, may have a first width, and the conductive pad 103 may have a second width greater than the first width. When viewed perpendicular to the substrate 101, the conductive pad 103 may have a circular shape, however, other shapes may be provided. The via in the insulating layer 107 may have a shape similar to that of the conductive pad 103 but smaller so that edge portions of the conductive pad 103 are covered by the insulating layer 107.

Figure 1D:
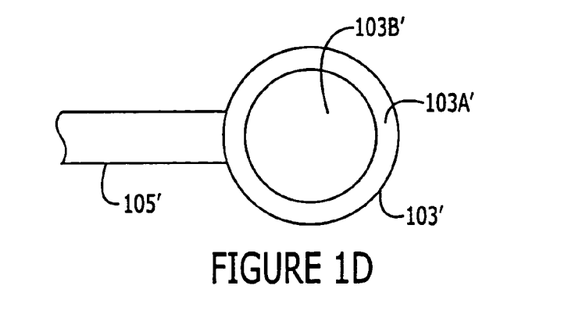
FIG. 1D is a plan view of a conductive pad and trace according to embodiments of the present invention.

A plan view of an example of a conductive pad 103' and a conductive trace 105' according to embodiments of the present invention is illustrated in FIG. 1D. A peripheral portion 103A' of the conductive pad 103' may be covered by an overlying insulating layer, and an interior portion 103B' of the conductive pad 103 may be free of an overlying insulating layer. Accordingly, electrical coupling to a solder layer may be provided through the interior portion 103B' of the conductive pad 103'.

The conductive pad 103 and conductive trace 105, for example, may comprise a layer or layers of conductive materials such as copper, aluminum, nickel, titanium, and/or combinations and/or alloys thereof. In addition, the conductive pad 103 may be electrically coupled to a portion of the substrate opposite the via so that the conductive trace is not required.

A seed layer 110 may be formed on the insulating layer 107, on sidewalls of the via through the insulating layer, and on portions of the conductive pad 103 free of the insulating layer 107. The seed layer 110, for example, may be used as a plating electrode for subsequent electroplating. More particularly, the seed layer 110 may include an adhesion layer 109 to provide adhesion between subsequently electroplated layers and the conductive pad 103 and the insulating layer 107. The adhesion layer, for example, may include a layer of titanium, tungsten, chrome, and/or combinations thereof. The seed layer 110 may also include a plating conduction layer 111, such as a layer of copper. The plating conduction layer, for example, may have a thickness in the range of approximately 0.1 $\mu$m to 0.5 $\mu$m. The plating conduction layer may provide electrical conduction for subsequent electroplating. According to some embodiments of the present invention, the seed layer 110, including the adhesion layer 109 and the plating conduction layer 111, may have a thickness of approximately 0.15 $\mu$m.

A conductive shunt layer 113, a barrier layer 115, and a solder layer 117 can then be selectively formed on the seed layer 110. As shown, the conductive shunt layer 113, the barrier layer 115, and the solder layer 117 may be selectively formed on portions of the seed layer 110 opposite the conductive pad 103, opposite sidewalls of the via exposing the conductive pad 103, and opposite portions of the insulating layer 107 surrounding the via. In an alternative, the conductive shunt layer 113, the barrier layer 115, and the solder layer 117 may be selectively formed on portions of the seed layer 110 remote from the conductive pad 103.

According to particular embodiments of the present invention, the conductive shunt layer 113, the barrier layer 115, and the solder layer 117 may be selectively formed by electroplating through a mask. More particularly, a mask may be formed on the seed layer 110, wherein the mask has a pattern exposing portions of the seed layer 110 on which the conductive shunt layer, the barrier layer, and the solder layer are to be electroplated. The seed layer can then provide an electroplating electrode for successively plating the conductive shunt layer 113, the barrier layer 115, and the solder layer 117. Once the electroplating has been completed, the mask can be removed. While electroplating has been discussed as a means for forming the conductive shunt layer, the barrier layer, and the solder layer, these layers may be formed by other means such as electroless plating, evaporation, sputtering, solder paste, solder ball placement, liquid metal jetting, and/or chemical vapor deposition. Moreover, one or more of the conductive shunt layer, the barrier layer, and/or the solder layer may be formed non-selectively across the substrate and then patterned using photolithography to provide the structure illustrated in FIG. 1A.

Moreover, the conductive shunt layer 113 may be a layer of a metal, such as copper, having a thickness of at least approximately 0.5 μm. According to particular embodiments, the conductive shunt layer 113 may be a layer of a metal having a thickness of at least approximately 1.0 μm, and more particularly having a thickness in the range of approximately 1.0 μm to 5.0 μm. The barrier layer 115 may be a layer of a barrier metal, such as nickel, platinum, palladium, and/or combinations thereof, having a thickness in the range of approximately 1 μm to 2 μm. The solder layer 117 may be a layer of lead-tin solder, but other solder materials may be used.

After forming the conductive shunt layer 113, the barrier layer 115, and the solder layer 117, portions of the seed layer 110 may remain free of the conductive shunt layer, the barrier layer, and the solder layer, as shown in FIG. 1A. These exposed portions of the seed layer 110 may be selectively removed using the solder layer 117, the barrier layer 115, and/or the conductive shunt layer 113 as a patterning mask. For example, an etch chemistry may be selected that etches the seed layer selectively with respect to the solder layer 117 and/or the barrier layer 115. Accordingly, the exposed portions of the seed layer 110 may be selectively removed without requiring a separate masking step, as shown in FIG. 1B, to provide the patterned seed layer 110' which includes the patterned conductive adhesion layer 109' and the patterned plating conduction layer 111'.

The solder layer 117 can then be heated above its melting temperature (also referred to as a reflow operation) and then cooled to provide a rounded solder bump 117' as shown in FIG. 1C. In an alternative, the solder layer 117 may be heated above its melting temperature and then cooled while in contact with a pad of another substrate to provide mechanical and/or electrical coupling between the substrate 101 and the other substrate. By providing a relatively thick conductive shunt layer 113, current can be distributed more evenly across the solder bump 117'. Accordingly, electromigration and/or void formation within the solder bump 117' may be reduced and/or a mean time to failure may be increased.

Moreover, the barrier layer 115 may help maintain an integrity of the conductive shunt layer 113 during reflow of the solder layer 117. In general, the conductive shunt layer 113 may comprise a material that may readily dissolve into solder while the barrier layer 115 may comprise a material that does not readily dissolve into the solder layer 117 during solder reflow. Accordingly, a dissolvable material of the conductive shunt layer 113 may be protected by the barrier layer 115 during solder reflow. According to a particular embodiment, the conductive shunt layer 113 may comprise copper which may readily dissolve into lead-tin solder, and the barrier layer 115 may comprise a metal (such as nickel, platinum, palladium, and/or combinations thereof) that may not readily dissolve into lead-tin solder. A layer of a passivating material such as gold may also be provided on the barrier layer 115.

By providing a relatively thick conductive shunt layer 113 extending along exposed portions of the conductive pad 103, along via sidewalls, and along surface portions of the insulating layer 107 adjacent the via, electrical current flowing between the conductive pad 103 and another substrate may be more evenly distributed across the solder bump 117'. Accordingly, electromigration and/or void formation within the solder bump 117' may be reduced, and/or a lifetime of the device may be increased.

In an alternative or in addition to the barrier layer 115, a passivation layer, such as a layer of gold, may be formed on the conductive shunt layer 113. For example, the passivation layer can be formed by plating using the same mask used when forming the conductive shunt layer 113. A solder ball can then be placed on the passivation layer instead of plating a solder layer. The mask and/or the seed layer 110 can be removed before or after placement of the solder ball. For example, portions of the seed layer 110 covered by the conductive shunt layer 113 and the passivation layer can be maintained while removing portions of the seed layer 110 not covered by the passivation layer and the conductive shunt layer 113 using an etch chemistry that selectively removes materials of the seed layer 110 with respect to the passivation layer and/or the solder ball.

Figure 2A:
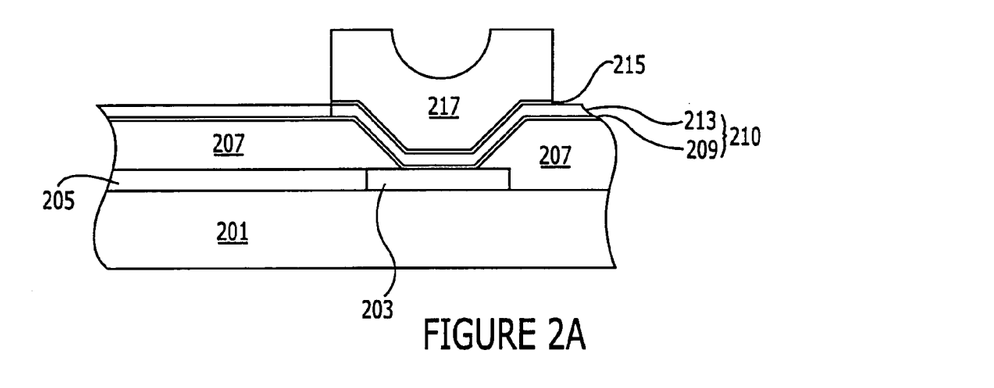
FIGS. 2A–2C are cross-sectional views illustrating steps of forming electronic structures according to additional embodiments of the present invention.
Figure 2B:
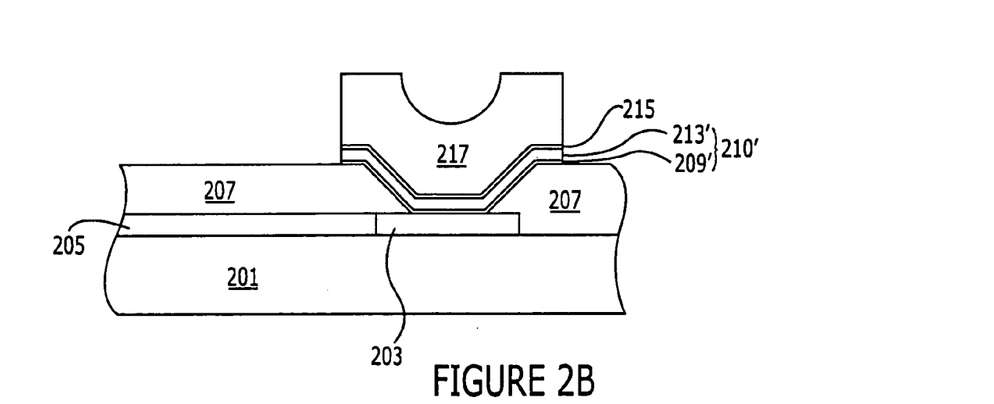
Figure 2C:
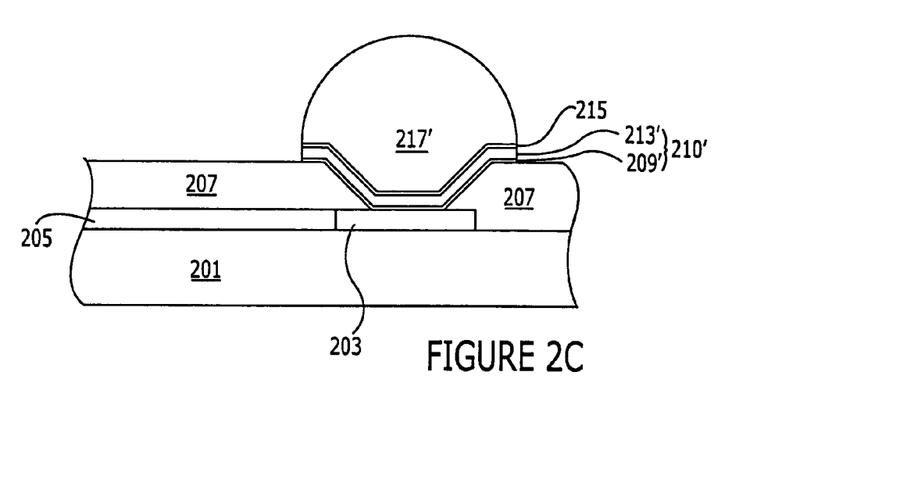

According to additional embodiments of the present invention, the conductive shunt layer may be provided as a part of a seed layer, and a separate plating conduction layer may not be required. Steps of forming electronic structures including conductive shunt layers as a part of a seed layer are illustrated in FIGS. 2A–C. As shown in FIG. 2A, an electronic structure may include a conductive pad 203 on a substrate 201, and an insulating layer 207 on the substrate 201 and conductive pad 203 with a via therein so that portions of the conductive pad 203 are free of the insulating layer 207. In addition, the electronic structure may include a conductive trace 205 providing coupling between the conductive pad 203 and other portions of the electronic structure. The conductive trace 205, for example, may have a first width, and the conductive pad 203 may have a second width greater than the first width. When viewed perpendicular to the substrate 201, the conductive pad 203 may have a circular shape, however, other shapes may be provided. The via in the insulating layer 207 may have a shape similar to that of the conductive pad 203 but smaller so that edge portions of the conductive pad 103 are covered by the insulating layer 207.

Figure 2D:
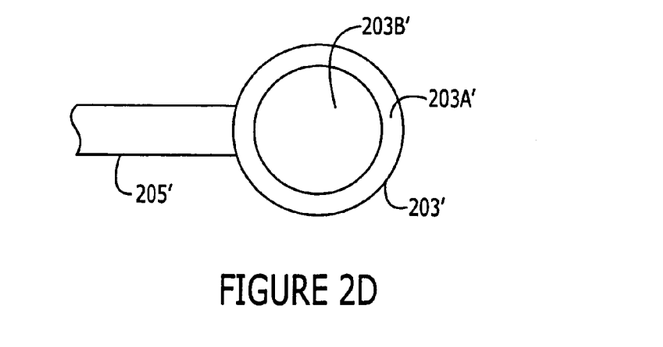
FIG. 2D is a plan view of a conductive pad and trace according to embodiments of the present invention.

A plan view of an example of a conductive pad 203' and a conductive trace 205' according to embodiments of the present invention is illustrated in FIG. 2D. A peripheral portion 203A' of the conductive pad 203' may be covered by an overlying insulating layer, and an interior portion 203B' of the conductive pad 203 may be free of an overlying insulating layer. Accordingly, electrical coupling to a solder layer may be provided through the interior portion 203B' of the conductive pad 203'.

A seed layer 210 may be formed on the insulating layer 207, on sidewalls of the via through the insulating layer, and on portions of the conductive pad 203 free of the insulating layer 207. The seed layer 210, for example, may be used as a plating electrode for subsequent electroplating. More particularly, the seed layer 210 may include a relatively thick conductive shunt layer 213. The seed layer 210 may also include an adhesion layer 209 to provide adhesion between the conductive shunt layer 213 and the conductive pad 203 and the insulating layer 207. The adhesion layer, for example, may include a layer of titanium, tungsten, chrome, and/or combinations thereof.

The conductive shunt layer 213 may thus be formed across an entirety of the insulating layer 207, and the conductive shunt layer 213 may be a layer of a metal such as copper, having a thickness of at least approximately 0.5 μm. According to particular embodiments, the conductive shunt layer may be a layer of a metal, such as copper, having a thickness of at least approximately 1.0 μm, and more particularly the conductive shunt layer may have a thickness in the range of approximately 1.0 μm to 5.0 μm. The conductive shunt layer 213 may provide a conduction layer for subsequent electroplating.

A barrier layer 215, and a solder layer 217 can then be selectively formed on the seed layer 210. As shown, the barrier layer 215, and the solder layer 217 may be selectively formed on portions of the seed layer 210 opposite the conductive pad 203, opposite sidewalls of the via exposing the conductive pad 203, and opposite portions of the insulating layer 207 surrounding the via. In an alternative, the barrier layer 215, and the solder layer 217 may be selectively formed on portions of the seed layer 210 remote from the conductive pad 203.

According to particular embodiments of the present invention, the barrier layer 215, and the solder layer 217 may be selectively formed by electroplating through a mask. More particularly, a mask may be formed on the seed layer 210, wherein the mask has a pattern exposing portions of the seed layer 210 on which the barrier layer, and the solder layer are to be electroplated. The seed layer can then provide an electroplating electrode for successively plating the barrier layer 215, and/or the solder layer 217. Once the electroplating has been completed, the mask can be removed. While electroplating has been discussed as a means for forming the barrier layer, and the solder layer, these layers may be formed by other means such as electroless plating, evaporation, sputtering, solder paste, solder ball placement, liquid metal jetting, and/or chemical vapor deposition. Moreover, one or more of the barrier layer, and/or the solder layer may be formed non-selectively across the substrate and then patterned using photolithography to provide the structure illustrated in FIG. 2A.

The barrier layer 215 may be a layer of a barrier metal (such as nickel, platinum, palladium, and/or combinations thereof) having a thickness in the range of approximately 1 $\mu$m to 2 $\mu$m. The solder layer 217 may be a layer of lead-tin solder, but other solder materials may be used.

After forming the barrier layer 215, and the solder layer 217, portions of the seed layer 210 may remain free of the barrier layer, and the solder layer, as shown in FIG. 2A. These exposed portions of the seed layer 210 may be selectively removed using the solder layer 217 and/or the barrier layer 215 as a patterning mask. For example, an etch chemistry may be selected that etches the seed layer selectively with respect to the solder layer 217 and/or the barrier layer 215. Accordingly, the exposed portions of the seed layer 210 may be selectively removed without requiring a separate masking step as shown in FIG. 2B to provide the patterned seed layer 210' including conductive shunt layer 213'. The patterned seed layer 210' may also include patterned adhesion layer 209'.

The solder layer 217 can then be heated above its melting temperature (also referred to as a reflow operation) and then cooled to provide a rounded solder bump 217' as shown in FIG. 2C. In an alternative, the solder layer 217 may be heated above its melting temperature and then cooled while in contact with a pad of another substrate to provide mechanical and/or electrical coupling between the substrate 201 and the other substrate. By providing a relatively thick conductive shunt layer 213, current can be distributed more evenly across the solder bump 217'. Accordingly, electromigration and/or void formation within the solder bump 217' may be reduced and/or a mean time to failure may be increased.

Moreover, the barrier layer 215 may help maintain an integrity of the conductive shunt layer 213 during reflow of the solder layer 217. In general, the conductive shunt layer 213 may comprise a material that may readily dissolve into solder while the barrier layer 215 may comprise a material that does not readily dissolve into the solder layer 217 during solder reflow. Accordingly, a dissolvable material of the conductive shunt layer 213 may be protected by the barrier layer 215 during solder reflow. According to a particular embodiment, the conductive shunt layer 213 may comprise copper which may readily dissolve into lead-tin solder, and the barrier layer 215 may comprise a metal (such as nickel, platinum, palladium, and/or combinations thereof) that may not readily dissolve into lead-tin solder. The barrier layer 215 may also comprise a layer of a passivating material such as gold.

By providing a relatively thick conductive shunt layer 213 extending along exposed portions of the conductive pad 203, along via sidewalls, and along surface portions of the insulating layer 207 adjacent the via, electrical current flowing between the conductive pad 203 and another substrate may be more evenly distributed across the solder bump 217'. Accordingly, electromigration and/or void formation within the solder bump 217' may be reduced, and/or a lifetime of the device may be increased.

The conductivity of a conductive shunt layer according to embodiments of the present invention may significantly reduce a current density in solder at a critical region of the via. By selecting the materials and thicknesses of the conductive shunt layer, an amount of current carried by the conductive shunt layer on the via sidewalls can reduce a current density in the solder by 25% or more. Because electromigration lifetime may depend on the inverse square of the current density, a 25% reduction in current density may effectively double a lifetime of a device including a conductive shunt layer according to embodiments of the present invention. A thickness of a conductive shunt layer can thus be chosen to increase lifetime with respect to electromigration failure.

Solders may be sensitive to electromigration due to their relatively low melting points. In flip chip solder bumps, a critical region may be the via where current may be crowded into an area with a radius smaller than that of the body of the bump. Here, the higher current density can lead to shortened lifetime due to electromigration.

Figure 3A:
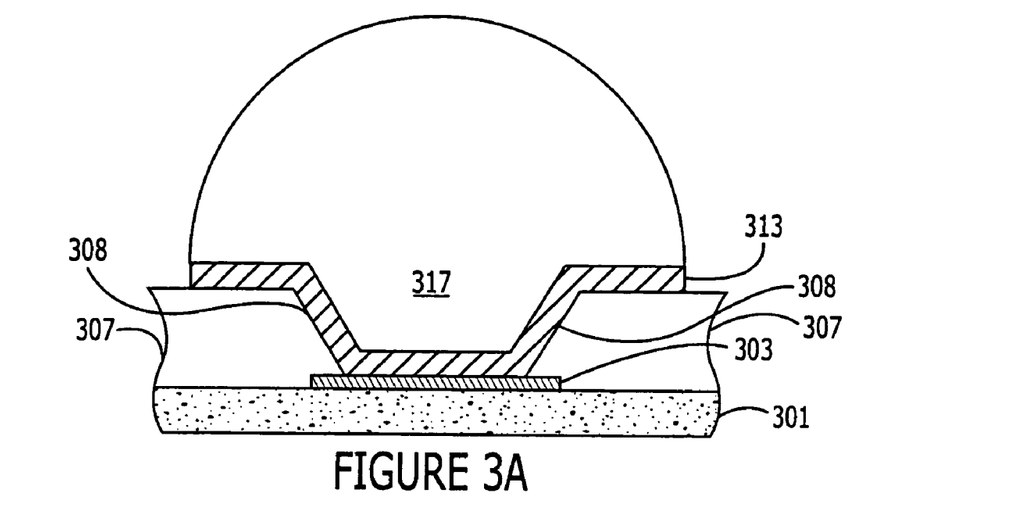
FIGS. 3A–C are respective cross-sectional, plan, and perspective views of electronic structures according to embodiments of the present invention.
Figure 3B:
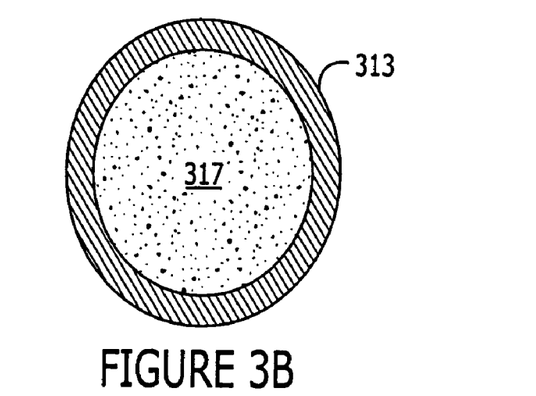
Figure 3C:
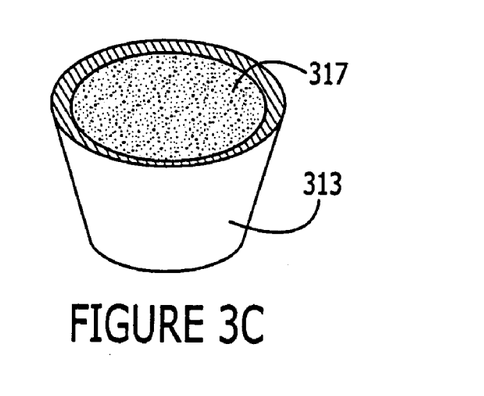

In a first approximation, the via may be viewed a simple right cylinder, although the processing of the insulating layer can lead to sloping via sidewalls, as shown in FIGS. 3A–C. As shown in FIG. 3A, an electronic structure according to embodiments of the present invention may include a conductive pad 303 on substrate 301, and an insulating layer 307 on the substrate 301 and conductive pad 303. More particularly, the insulating layer 307 may have a via 308 therein so that portions of the conductive pad 303 are free of the insulating layer 307. A conductive shunt layer 313 may be provided on portions of the conductive pad 303 free of the passivation layer 307, on sidewalls of the via 308, and on portions of the passivation layer 307 adjacent the via 308, and a solder layer 317 may be provided on the conductive shunt layer 313.

The conductive shunt layer 313 may be a layer of a metal, such as copper, having a thickness of at least approximately 0.5 $\mu$m. According to particular embodiments, the conductive shunt layer 313 may be a layer of a metal having a thickness of at least approximately 1.0 $\mu$m, and more particularly in the range of approximately 1.0 $\mu$m to 5.0 $\mu$m. Moreover, the conductive shunt layer 313 may include an adhesion layer, such as a layer of titanium, tungsten, chrome, and/or combinations thereof, adjacent the insulating layer 307 and the conductive pad 303, and the conductive shunt layer 313 may also include a barrier layer, such as a layer of nickel, platinum, palladium, and/or combinations thereof, adjacent the-solder layer 317. FIGS. 3B and 3C are top and perspective views, respectively, of portions of the conductive shunt layer 313 and solder layer 317 within the via 308.

The conductivity of a conventional underbump metallurgy layer (UBM) is often ignored in flip chip design because the current flow may be substantially parallel to the thickness direction of the UBM and the UBM may account for only 1% of a total bump thickness. In a region of the via 308 in a structure including a conductive shunt layer 313 according to embodiments of the present invention, however, current may be conducted perpendicular to the thickness direction, through the conductive shunt layer 313 along via 308 sidewalls. Here the conductive shunt layer 313 conductivity can aid in reducing a current density of the solder layer 317 adjacent the via 308 edge on the conductive pad 303 and in improving a lifetime of a solder joint.

A current-carrying cross sectional area of a conductive shunt layer 313 according to embodiments of the present invention may be relatively large because it is at the circumference of the cylinder and the conductive shunt layer 313 metal may be more conductive than the solder of solder layer 317. For a via of diameter 150 μm microns with a conductive shunt layer of 3 μm thickness, some 31% percent of the current flows in the conductive shunt layer 313. Because lifetime is proportional to inverse square of current density:

$$MTTF \propto J^{-2}.$$

a 31% percent reduction in solder current density may result in an 2.1 fold increase in solder bump lifetime.

Conductive shunt layers may thus act as current spreading layers according to embodiments of the present invention. Stated in other words, a conductive shunt layer may spread current across a bottom surface of a solder layer so that current is more evenly distributed across a cross section of the solder layer parallel with the substrate and so that current crowding in the solder layer at a via corner adjacent a line entry to the conductive pad can be reduced. As discussed above, current entering/exiting the solder layer can be spread along via sidewalls and onto a surface of an insulating layer opposite the conductive pad through the conductive shunt layer.

Figure 4A:
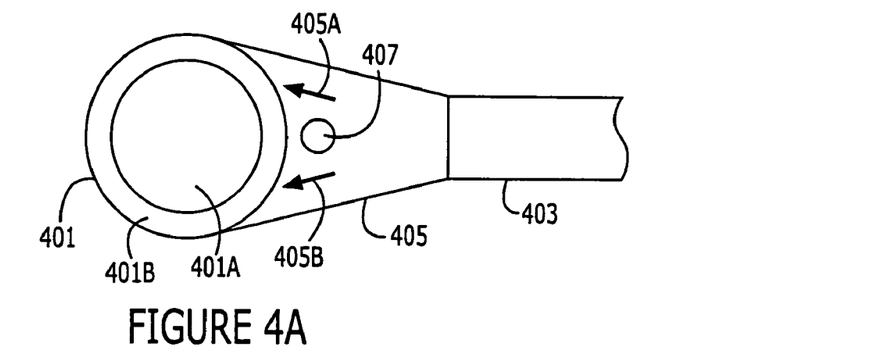
FIGS. 4A–E are plan views illustrating conductive interconnects according to embodiments of the present invention.

According to additional embodiments of the present invention, current crowding may be reduced by providing a plurality of current paths to a conductive pad on which a solder layer is formed. As shown in FIG. 4A, a conductive pad 401 may be provided on an insulating layer of a substrate, and a conductive trace 403 may provide routing of electrical signals between the conductive pad 401 and another portion of the substrate. In addition, an electrical coupling 405 may provide at least two separate current flow paths between the conductive trace 403 and the conductive pad 401. As discussed above with respect to FIGS. 1A–C and 2A–C, an insulating layer may be provided on the substrate, on the conductive trace 403, and on the conductive pad 401. Moreover, a via may be provided in the insulating layer so that an interior portion 401A of the conductive pad 401 is free of the passivation layer and so that a peripheral portion 401B of the conductive pad 401 is covered by the passivation layer.

The conductive pad 401, the conductive trace 403, and the electrical coupling 405 may comprise a common structure. More particularly, the conductive pad 401, the conductive trace 403, and the electrical coupling 405 may be formed by providing a conductive layer on the substrate, and patterning the conductive layer using photolithography. As shown, the conductive trace 403 may have a first width, and the conductive pad 401 may have a second width greater than the first width. Use of a relatively narrow conductive trace may facilitate routing a plurality of conductive traces/pads on a common substrate, and use of a relatively wide conductive pad may facilitate use of relatively large solder bumps.

As shown, the electrical coupling 405 between the conductive trace 403 and the conductive pad 401 may provide at least two separate current flow paths 405A and 405B between the conductive trace and the conductive pad. More particularly, the separate current flow paths may be defined by providing a perforation 407 in the electrical coupling 405 between the conductive pad 401 and the conductive trace 403 so that separate current flow paths are provided on either side of the perforation. Moreover, the electrical coupling 405 may be flared to provide contact with a relatively large portion of the conductive pad. While the conductive trace 403 and the electrical coupling 405 are provided with separate reference numbers, it will understood that the electrical coupling may be considered a part of the conductive trace.

Figure 4B:
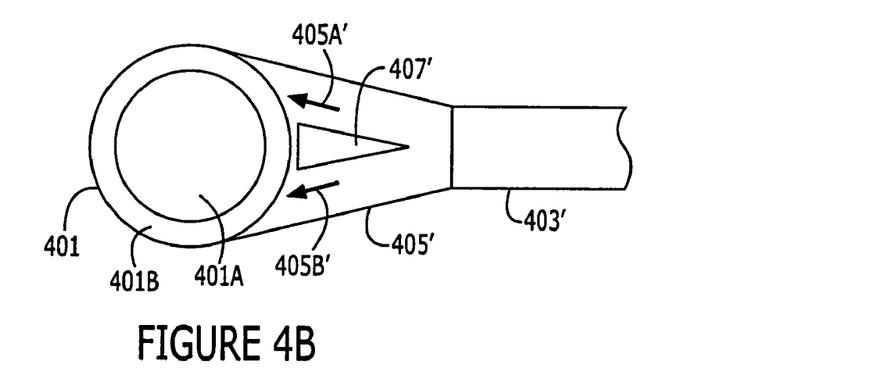

By providing the perforation 407 in a center portion of the electrical coupling, a local current flow through the center of the electrical coupling may be blocked so that a more even distribution of current can be provided to a solder layer on the portion 401A of the conductive pad 401 free of the passivation layer. Stated in other words, a peak current density in the solder layer at the via edge may be reduced by including the perforation 407. As shown in FIG. 4A, the perforation 407 may be circular, but the perforation may have other shapes. As shown in FIG. 4B, the perforation 407' in electrical coupling 405' may have a slotted shape to provide separate current paths 405A' and 405B'. More particularly, the perforation 407' may be flared and/or may have a triangular shape. In an alternative, the separate current paths 405A' and 405B' may be viewed as first and second traces extending from the conductive trace 403 to the conductive pad 401.

Figure 4C:
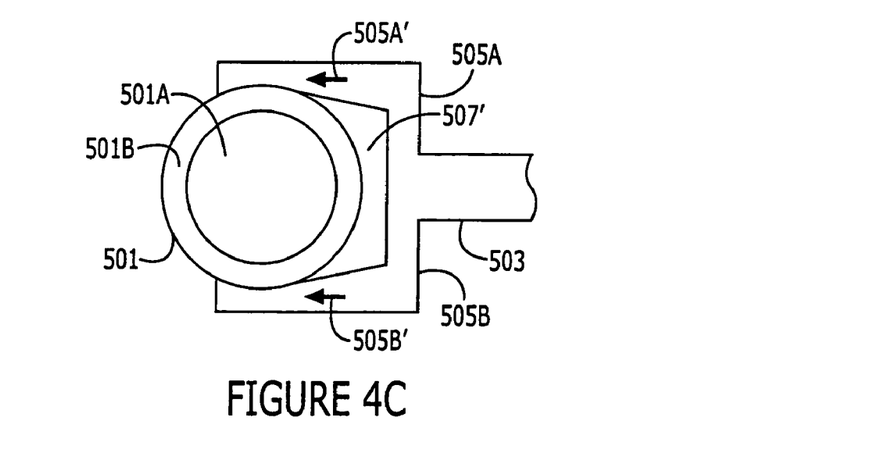

Electrical couplings according to additional embodiments of the present invention are illustrated in FIG. 4C. As shown, a conductive pad 501 may be provided on an insulating layer of a substrate, and a conductive trace 503 may provide routing of electrical signals between the conductive pad 501 and another portion of the substrate. In addition, an electrical coupling including separate traces 505A and 505B may provide at least two separate current flow paths between the conductive trace 503 and the conductive pad 501. As discussed above with respect to FIGS. 1A–C and 2A–C, an insulating layer may be provided on the substrate, on the conductive trace 503, and on the conductive pad 501. Moreover, a via may be provided in the insulating layer so that an interior portion 501A of the conductive pad 501 is free of the passivation layer and so that a peripheral portion 501B of the conductive pad 501 is covered by the passivation layer.

The conductive pad 501, the conductive trace 503, and the electrical coupling 505 may comprise a common structure. More particularly, the conductive pad 501, the conductive trace 503, and the electrical coupling 505 may be formed by providing a conductive layer on the substrate, and patterning the conductive layer using photolithography. As shown, the conductive trace 503 may have a first width, and the conductive pad 501 may have a second width greater than the first width. Use of a relatively narrow conductive trace may facilitate routing a plurality of conductive traces/pads on a common substrate, and use of a relatively wide conductive pad may facilitate use of relatively large solder bumps.

As shown, the electrical coupling 505 between the conductive trace 503 and the conductive pad 501 may include at least two separate traces 505A and 505B providing at least two separate current flow paths 505A' and 505B' between the conductive trace and the conductive pad. The region 507' between the separate traces 505A and 505B may be free of a conductive material from which the electrical coupling 505 is formed. Moreover, the separate traces 505A and 505B may contact opposite sides of the conductive pad 501 as shown in FIG. 4C. Accordingly, current may be provided to the conductive pad 501 and to a solder layer on the interior portion 501A of the conductive pad 501 from opposite sides thereof.

Figure 4D:
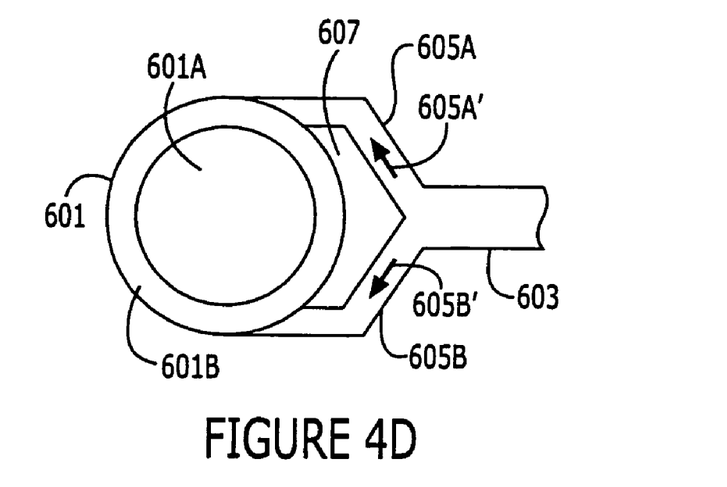

Electrical couplings according to additional embodiments of the present invention are illustrated in FIG. 4D. As shown, a conductive pad 601 may be provided on an insulating layer of a substrate, and a conductive trace 603 may provide routing of electrical signals between the conductive pad 601 and another portion of the substrate. In addition, an electrical coupling including separate traces 605A and 605B may provide at least two separate current flow paths 605A' and 605B' between the conductive trace 603 and the conductive pad 601. As discussed above with respect to FIGS. 1A–C and 2A–C, an insulating layer may be provided on the substrate, on the conductive trace 603, and on the conductive pad 601. Moreover, a via may be provided in the insulating layer so that an interior portion 601A of the conductive pad 601 is free of the passivation layer and so that a peripheral portion 601B of the conductive pad 601 is covered by the passivation layer.

The conductive pad 601, the conductive trace 603, and the separate traces 605A and 605B may comprise a common structure. More particularly, the conductive pad 601, the conductive trace 603, and the separate traces 605A and 605B may be formed by providing a conductive layer on the substrate, and patterning the conductive layer using photolithography. As shown, the conductive trace 603 may have a first width, and the conductive pad 601 may have a second width greater than the first width. Use of a relatively narrow conductive trace may facilitate routing a plurality of conductive traces/pads on a common substrate, and use of a relatively wide conductive pad may facilitate use of relatively large solder bumps.

As shown, the separate traces 605A and 605B between the conductive trace 603 and the conductive pad 601 may provide at least two separate current flow paths 605A' and 605B' between the conductive trace and the conductive pad. The region 607 between the separate traces 605A and 605B may be free of a conductive material from which the electrical coupling 605, the conductive trace 603, and the conductive traces 605A and 605B are formed. Moreover, the separate traces 605A and 605B may extend tangentially from the conductive pad 601, and/or the separate traces 605A and 605B may extend in a parallel direction from the contact pad 601. Accordingly, separate current paths 605A' and 605B' may be provided to the conductive pad 601 and to a solder layer on the interior portion 601A of the conductive pad 601 at relatively widely spaced apart portions of the conductive pad without significantly increasing a width of the conductive pad when combined with the separate traces 605A and 605B.

Figure 4E:
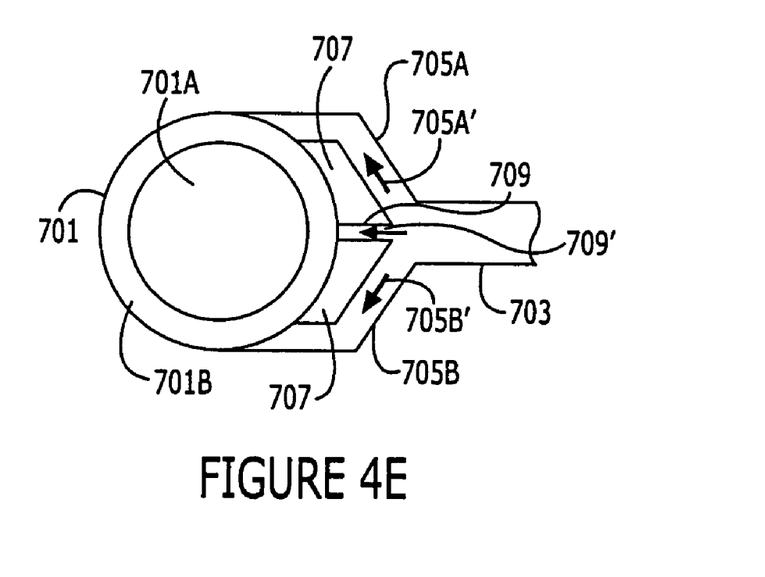

Electrical couplings according to additional embodiments of the present invention are illustrated in FIG. 4E. As shown, a conductive pad 701 may be provided on an insulating layer of a substrate, and a conductive trace 703 may provide routing of electrical signals between the conductive pad 701 and another portion of the substrate. In addition, an electrical coupling including separate traces 705A and 705B may provide at least two separate current flow paths 705A' and 705B' between the conductive trace 703 and the conductive pad 701. As discussed above with respect to FIGS. 1A–C and 2A–C, an insulating layer may be provided on the substrate, on the conductive trace 703, and on the conductive pad 701. Moreover, a via may be provided in the insulating layer so that an interior portion 701A of the conductive pad 701 is free of the passivation layer and so that a peripheral portion 701B of the conductive pad 701 is covered by the passivation layer.

As shown, the separate traces 705A and 705B may be symmetric with respect to the conductive trace 703 as discussed above with regard to separate traces 605A and 605B of FIG. 4D. In addition, a third conductive trace 709 may be provided between the separate traces 705A and 705B. The third conductive trace 709 may provide a more even distribution of current to the conductive pad 701 and to a solder layer on interior portions 701A of the conductive pad 701. Moreover, the third trace 709 may be centered between the traces 705A and 705B so that current paths 705A' and 705B' provide relatively symmetric current flows, and a width of the third trace 709 may be narrow relative to a width of traces 705A and 705B so that a current through path 709' is not too great and so that sufficient current is maintained through paths 705A' and 705B'.

The conductive pad 701, the conductive trace 703, the first and second traces 705A and 705B, and the third trace 709 may comprise a common structure. More particularly, the conductive pad 701, the conductive trace 703, the first and second separate traces 705A and 705B, and the third trace 709 may be formed by providing a conductive layer on the substrate, and patterning the conductive layer using photolithography. As shown, the conductive trace 703 may have a first width, and the conductive pad 701 may have a second width greater than the first width. Use of a relatively narrow conductive trace may facilitate routing a plurality of conductive traces/pads on a common substrate, and use of a relatively wide conductive pad may facilitate use of relatively large solder bumps.

The regions 707 between the separate traces 705A, 705B, and 709 may be free of a conductive material from which the electrical coupling 705, the conductive trace 703, and the conductive traces 705A, 705B, and 709 are formed. Moreover, the separate traces 705A and 705B may extend tangentially from the conductive pad 701, and/or the separate traces 705A and 705B may extend in a parallel direction from the contact pad 701. Moreover, the separate traces 705A and 705B may be symmetrical about the trace 709. Accordingly, separate and spaced apart current paths 705A', 705B', and 709 may be provided to the conductive pad 701 and to a solder layer on the interior portion 701A of the conductive pad 701.

The conductive pads, conductive traces, and electrical couplings discussed above with regard to FIGS. 4A–E (shown from plan views), may be implemented in place of the conductive traces 105 and/or 205 and conductive pads 103 and/or 203 (shown in cross section) of FIGS. 1A–C and 2A–C. Accordingly, peripheral portions 401B, 501B, 601B, and/or 701B of conductive pads 401, 510, 601, and 701 may be covered with an insulating layer, and the insulating layer may have a via therein so that interior portions 401A, 501A, 601A, and/or 701A of conductive pads 401, 510, 601, and 701 are free of the insulating layer. Moreover, a solder layer may be formed on the interior portions of the conductive pads, on sidewalls of the via in the insulating layer, and on portions of the insulating layer surrounding the via. In addition, a conductive shunt layer may be provided between the solder layer and the conductive pad and the insulating layer. Stated in other words, conductive couplings and/or separate traces as discussed above with respect to FIGS. 4A–E and conductive shunt layers as discussed above with respect to FIGS. 1A–C, 2A–C, and 3A–C may be combined in electronic structures and devices according to embodiments of the present invention. Conductive traces 105 and 205 of FIGS. 1A–C and 2A–C may alternately be provided without a flared electrical coupling, without separate current paths, and/or without perforations.

In addition, placement of a trace in contact with a conductive pad may be determined relative to mechanical strain applied to a solder layer on the conductive pad after the solder layer is bonded to a second substrate. For example, if a solder layer according to the present invention is used to bond two substrates, lateral forces (parallel to the substrates) may be applied to the solder layer due, for example, to different thermal expansions of the substrates, and the solder layer may strain to absorb the stress. More particularly, one side of the solder layer on the conductive pad may be subjected to tensile strain, and an opposite side of the solder layer on the conductive pad may be subjected to compressive strain.

As discussed above, a greater current density may result in portions of a solder layer on a conductive pad adjacent a conductive trace providing the electrical interconnection for the pad. Moreover, the greater current density may result in more rapid electromigration and void formation in portions of the solder layer on a conductive pad adjacent a conductive trace providing electrical interconnection for the pad. Accordingly, one or more conductive traces may be coupled to the conductive pad adjacent a portion of the solder layer that is subjected to compressive stress. Accordingly, a void formed in the solder layer adjacent the coupling with the conductive trace may be compressed and shunted due to the compressive stress.

In an alternative, opposite sides of a solder layer on a conductive pad may be subjected to alternating compressive and tensile strains and portions of the solder layer between the opposite sides subjected to the compressive and tensile strains may be neutrally strained. In such a situation, it may be beneficial to provide that a conductive trace or traces are coupled to the conductive pad adjacent one or more neutrally strained portions of the solder layer. For example, a solder layer on the interior portion 501A of conductive pad 501 of FIG. 4C may be subjected to alternating compressive and tensile strains applied parallel to the direction of the trace 503. Accordingly, the separate traces 505A and 505B may be coupled to opposite sides of the conductive pad that may be neutrally strained.

Electronic structures according to embodiments of the present invention may thus include a primary conductive trace on an electronic substrate wherein the primary conductive trace has a first width, and a conductive pad on the electronic substrate wherein the conductive pad has a second width greater than the first width. An electrical coupling between the primary conductive trace and the conductive pad may provide different resistances to current flow across a width thereof. Different resistances may be provided, for example, by providing an opening in the electrical coupling such as the perforation 407 illustrated in FIG. 4A.

In an alternative, an electrical coupling according to embodiments of the present invention may have different thicknesses across a width thereof. The electrical coupling 405 of FIG. 4A, for example, may include a relatively thin layer of a conductive material in place of the perforation 407 wherein the relatively thin layer has a thickness that is less that a thickness of the remainder of the electrical coupling. Moreover, the relatively thin layer and the remainder of the electrical coupling may comprise the same material. In another alternative, the electrical coupling may include a layer of a first conductive material in place of the perforation 407 at a central portion thereof and a layer of a second conductive material along peripheral portions thereof wherein the first and second conductive materials have different resistivities. In addition, the layer of the second conductive material may extend across the electrical coupling on the layer of the first conductive material. Electrical couplings according to embodiments of the present invention may thus provide relatively uniform distribution of current for the conductive pad.

While this invention has been particularly shown and described with reference to preferred embodiments thereof, it will be understood by those skilled in the art that various changes in form and details may be made therein without departing from the spirit and scope of the invention as defined by the appended claims and their equivalents.

What is claimed is:

1. An electronic structure comprising:
   a conductive pad on a substrate;
   an insulating layer on the substrate and on the conductive pad, the insulating layer having a via therein so that a portion of the conductive pad opposite the substrate is free of the insulating layer;
   a seed layer on the portion of the conductive pad free of the insulating layer, on sidewalls of the via, and on a surface of the insulating layer opposite the substrate;
   a conductive shunt layer on the portion of the conductive pad free of the insulating layer, on sidewalls of the via, and on surface portions of the insulating layer surrounding the via opposite the substrate and the conductive pad, wherein the conductive shunt layer has a thickness of at least approximately 0.5 $\mu$m and wherein the conductive shunt layer comprises copper and wherein the seed layer is between the conductive shunt layer and the insulating layer and between the conductive shunt layer and the conductive pad;
   a conductive barrier layer on the conductive shunt layer wherein the conductive barrier layer comprises at least one of nickel, platinum, palladium, and/or combinations thereof; and
   a solder layer on the conductive barrier layer wherein the conductive shunt layer and the solder layer comprise different materials, wherein the conductive barrier layer is between the conductive shunt layer and the solder layer, wherein the conductive shunt layer, the conductive barrier layer, and the solder layer are on portions of the seed layer, and wherein portions of the seed layer are free of the conductive shunt layer, the conductive barrier layer, and the solder layer.

2. An electronic structure according to claim 1 wherein the solder layer has a rounded surface opposite the conductive shunt layer having the thickness of at least approximately 0.5 $\mu$m.

3. An electronic structure according to claim 1 wherein the conductive shunt layer has a thickness in the range of approximately 1.0 $\mu$m to 5.0 $\mu$m.

4. An electronic structure according to claim 1 further comprising:

a primary conductive trace on the substrate so that the primary conductive trace is between the substrate and the insulating layer; and an electrical coupling between the primary conductive trace and the conductive pad, the electrical coupling providing at least two separate current flow paths between the primary conductive trace and the conductive pad.

5. An electronic structure according to claim 1 further comprising:

a conductive barrier layer on the conductive shunt layer opposite the conductive pad and the insulating layer wherein the conductive barrier layer comprises at least one of nickel, palladium, platinum, and/or combinations thereof, wherein the solder layer and the barrier layer comprise different materials.

6. An electronic structure according to claim 5 wherein the conductive shunt layer comprises a layer of copper having a thickness of at least approximately 0.5 μm.

7. An electronic structure according to claim 1 wherein the seed layer comprises an adhesion layer of a material different than that of the conductive shunt layer.

8. An electronic structure according to claim 7 wherein the adhesion layer comprises titanium, tungsten, chrome, and/or combinations thereof.

9. An electronic structure according to claim 7 wherein the seed layer comprises a plating conduction layer on the adhesion layer opposite the substrate, wherein the plating conduction layer and the conductive shunt layer comprise a common material.

10. An electronic structure according to claim 1 wherein the conductive shunt layer has a thickness of at least approximately 1.0 μm.

11. An electronic structure comprising:

a conductive pad on a substrate;

an insulating layer on the substrate and on the conductive pad, the insulating layer having a via therein so that a portion of the conductive pad opposite the substrate is free of the insulating layer;

a conductive shunt layer on the portion of the conductive pad free of the insulating layer, on sidewalls of the via, and on surface portions of the insulating layer surrounding the via opposite the substrate and the conductive pad, wherein the conductive shunt layer has a thickness of at least approximately 1.0 μm and wherein the conductive shunt layer comprises copper;

a conductive barrier layer on the conductive shunt layer wherein the conductive barrier layer comprises at least one of nickel, platinum, palladium, and/or combinations thereof; and a solder layer on the conductive barrier layer, wherein the conductive shunt layer and the solder layer comprise different materials and wherein the conductive barrier layer is between the conductive shunt layer and the solder layer.

12. An electronic structure according to claim 11 further comprising:

a seed layer between the conductive shunt layer and the conductive pad and between the conductive shunt layer and the insulating layer.

13. An electronic structure according to claim 12 wherein the seed layer comprises an adhesion layer of a material different than that of the conductive shunt layer.

14. An electronic structure according to claim 13 wherein the adhesion layer comprises titanium, tungsten, chrome, and/or combinations thereof.

15. An electronic structure according to claim 13 wherein the seed layer comprises a plating conduction layer on the adhesion layer opposite the substrate, wherein the plating conduction layer and the conductive shunt layer comprise a common material.

16. An electronic structure according to claim 12 wherein the conductive shunt layer, the conductive barrier layer, and the solder layer are on portions of the seed layer, and wherein portions of the seed layer are free of the conductive shunt layer, the conductive barrier layer, and the solder layer.

17. An electronic structure according to claim 11 wherein the conductive shunt layer has a thickness in the range of approximately 1.0 μm to 5.0 μm.

18. An electronic structure according to claim 11 further comprising:

a primary conductive trace on the substrate so that the primary conductive trace is between the substrate and the insulating layer; and an electrical coupling between the primary conductive trace and the conductive pad, the electrical coupling providing at least two separate current flow paths between the primary conductive trace and the conductive pad.

* * * * *